United States Patent [19]

Masuda et al.

[11] Patent Number: 4,841,567
[45] Date of Patent: Jun. 20, 1989

[54] MEMORY DEVICE

[75] Inventors: Eiji Masuda, Kawasaki; Yasuhiko Fujita, Tokyo; Terufumi Takasaki, Yokohama, all of Japan

[73] Assignee: Kabushiki Kaisha Toshiba, Kawasaki, Japan

[21] Appl. No.: 246,965

[22] Filed: Sep. 21, 1988

Related U.S. Application Data

[63] Continuation of Ser. No. 893,906, Jul. 22, 1986, abandoned.

[30] Foreign Application Priority Data

Jul. 22, 1985 [JP] Japan ............... 60-161626

[51] Int. Cl.$^4$ ........................... H04M 1/272
[52] U.S. Cl. .................. 379/355; 365/189.05
[58] Field of Search ........... 379/216, 355, 356, 357, 379/354; 364/200; 365/189, 49; 371/21, 27

[56] References Cited

U.S. PATENT DOCUMENTS

| | | | |
|---|---|---|---|
| 3,576,447 | 4/1971 | McKenny | 307/221 |
| 3,906,461 | 9/1975 | Cappon | 340/172.5 |
| 4,429,375 | 1/1984 | Kobayashi et al. | 365/240 |
| 4,489,381 | 12/1984 | Lavallee et al. | 364/200 |
| 4,523,301 | 6/1985 | Kodota et al. | 365/49 |
| 4,532,606 | 7/1985 | Phelps | 364/900 X |
| 4,616,310 | 10/1986 | Dill et al. | 364/200 |
| 4,616,341 | 10/1987 | Andersen et al. | 364/200 X |
| 4,627,058 | 12/1986 | Moriyama | 371/37 |
| 4,644,500 | 2/1987 | Yonezu et al. | 365/189 |
| 4,644,504 | 2/1987 | Mahmood | 365/189 |
| 4,646,271 | 2/1987 | Uchiyama | 365/189 |
| 4,651,306 | 3/1987 | Yanagisawa | 365/189 |
| 4,651,308 | 3/1987 | Sato | 365/189 |
| 4,653,025 | 3/1987 | Minato et al. | 365/189 |
| 4,654,826 | 3/1987 | Yamanouchi et al. | 365/189 |
| 4,656,610 | 4/1987 | Yoshida et al. | 371/21 X |
| 4,667,330 | 5/1987 | Kumagai | 371/21 X |
| 4,672,610 | 6/1987 | Salick | 371/21 X |
| 4,680,760 | 7/1987 | Giles et al. | 371/21 |
| 4,680,762 | 7/1987 | Hardee et al. | 371/21 X |
| 4,701,919 | 10/1987 | Naitoh et al. | 371/21 |

FOREIGN PATENT DOCUMENTS 0145488 12/1984 European Pat. Off. .

OTHER PUBLICATIONS

ICASSP 80 Proceedings–IEEE Int. Conf. on Acoustics, Speech & Sign. Process, vol. 1 of 3, New York, U.S.A.

Primary Examiner—James L. Dwyer
Attorney, Agent, or Firm—Foley & Lardner, Schwartz, Jeffery Schwaab, Mack, Blumenthal & Evans

[57] ABSTRACT

The memory device memorizes a number corresponding to a plurality of digits, for example, a unit phone number using a first memory array. A desired number is obtained by selecting a Y address. A readout operation is executed by inputting whole data selected by a Y address to a second memory array at once and outputting data sequentially from the second memory array by one digit. A write operation is executed by inputting data sequentially to the second memory array by one digit and outputting data from the second memory array to the first memory array at once.

9 Claims, 4 Drawing Sheets

MEMORY DEVICE

This application is a continuation of application Ser. No. 893,906, filed July 22, 1986 now abandoned.

BACKGROUND OF THE INVENTION

This invention relates to a memory device, and more particularly, to a memory device utilized for storing phone numbers comprising an IC circuit.

FIG. 1 illustrates a circuit diagram of a memory device for phone numbers according to the prior art. The memory device comprises a memory array 100 having a plurality of memory cells 10 arranged as a matrix; a Y address decoder 30 which selects Y addresses of the memory array 100; an X address decoder 50 which selects X addresses of the memory array 100 in order to read out data to bus lines 40; data lines 60 through which data are read out from memory cells 10 selected by the Y address decoder 30; switches 70 which precharge the data lines 60; and switches 80 connected between the data lines 60 and the bus lines 40, which ON/OFF operation is controlled by the X address decoder 50. Since a unit phone number is stored in memory cells along a row of the matrix, a selection of a Y address corresponds to selection of a unit phone number.

FIGS. 2 and 3 are circuit diagrams showing examples of the prior art memory cell 10. A selecting operation effected by the Y address decoder 30 usually consists of a write operation and a readout operation, wherein each operation is executed separately.

In the memory cell illustrated in FIG. 2, a data memory part comprises of inverters 11 and 12, and a switch for writing and reading out data comprises transistors 13, 14, 15 and 16. A data line 60 is connected to a precharge switch 70 and to another data line 60' through an inverter 17.

In the memory cell illustrated in FIG. 3, a data memory part comprises an inverter 11 and a clocked inverter 18 controlled by a signal $\overline{W}$ which is an inverse signal of a write signal W, and a switch for writing and reading out data, the switch comprising transistors 13, 14 and a switch 19 controlled by the write signal W. In both the circuits described above, a data is stored in a line 20 in the data memorizing part.

The operation of the memory device illustrated in FIG. 1 is as follows. Firstly, an operation of reading out data is explained. When a Y address is selected by the Y address decoder 30, data in the memory cells 10 along the row corresponding to the selected address are outputted to data lines 60. Since one digit of a phone number is represented by a number of bits in a memory device, the corresponding number of bus lines is provided. Therefore a data having the number of bits is outputted simultaneously.

A unit phone number data is sequentially outputted to the bus lines 40, digit after digit, from the upper order digits to the lower order digits when X addresses are successively selected. Therefore all the digits constituting the unit phone number are successively obtained on bus lines 40.

In the case of the memory device shown in FIG. 1, one digit consists of 5 data bits. When the data in memory cells 10 are to be outputted to the data lines 60, the data lines 60 must be precharged to a high level. This precharge is made by turning on the precharge switch 70 at a predetermined timing so that the source voltage $V_{DD}$ is applied to the data lines.

The precharge is needed because of the following reason. When the memory cell 10 holds a high level data (hereinafter merely referred to as "H"), that is, the line 20 holds "H", the data "H" cannot be read out from the memory part to the data line 60 if it is not precharged, because the transistor 13 is turned off. If the data line 60 is precharged by turning on the precharge switch 70, the data "H" can be obtained on the data line 60, thus reading out "H". On the other hand, when the memory cell 10 holds a low level data (hereinafter merely referred to as "L"), that is, the line 20 holds "L", the data "L" can be read out from the memory part to the data line 60 through the transistors 13 and 14 because these transistors are turned on. Though the precharge switch 70 is still turned on, the data "L" can be obtained on the data line 60 because the sum of the resistance values of transistors 13 and 14 in the ON condition is set to become much smaller than the resistance value of the precharge switch 70 in the ON condition.

Secondly, the operation of writing data will now be described. A data for each digit of a phone number is successively transmitted to the bus lines 40, digit after digit, from the upper order digit to the lower order digit at a predetermined timing. The transmitted data for each digit is stored in five memory cells selected by the Y address decoder 30 and the X address decoder 50. Before this storing operation, the voltage level in each data line 60 must be set to the same level as in the corresponding memory cell along the row selected. This reason is described as follows.

When a storing operation is executed, all the transistors 15, 16 or all the switches 19 in memory cells along the row selected by the Y address decoder are turned on so that all data lines 60 are connected to memory cells along the row selected. During this storing operation, although memory cells located in the row selected by the Y address decoder and in the columns selected by the X address decoder are refreshed with the data in the data lines 60, the other memory cells located in the same row should still hold their former data without regard to the data in the data lines 60. This is the reason why the voltage level in each data line 60 must be the same as that in the corresponding memory cell. In conclusion, before every write operation, an extra readout operation is needed so that the former data in the memory cells along the selected row are outputted to the data lines 60. Otherwise some data in the memory cells would be changed unexpectedly.

As described above, a unit phone number comprises a plurality of digits, and each digit consists of a number of bits (in this example, five bits). Therefore, in a readout operation, the X address decoder 50 must select each group of five adjacent bit addresses succeedingly one after another so as to output a series of one digit data to the bus lines 40. In the memory cell 10 shown in FIGS. 2 or 3, the data lines 60 must be precharged by turning on the precharge switches 70 every time when the address shift is made by the X address decoder 50.

This frequent precharge causes the following problems. That is, as far as a memory cell 10 outputting "L" is concerned, an electric current flows from a power source $V_{DD}$ to a power source $V_{SS}$ through the precharge switches 70 and the transistors 13 and 14 during all the precharging time. This wastes electric power, especially in a device having a lot of memory cells.

Another problem of the prior art described above is concerned with the drive ability of memory cells. Because of parasitic capacitance of the bus lines 40 etc., a memory cell must have sufficient drive ability to transmit output data to the bus lines 40. In order to provide sufficient drive ability, each semiconductor device which constitutes a memory cell must be designed to have a large dimension, and therefore, integration of memory cells is prevented. Besides, the voltage of a power source must be set relatively high.

Additional problem is concerned with operating speed. As described above, before every write operation, an extra readout operation must be taken. This procedure delays the operation speed.

SUMMARY OF THE INVENTION

An object of the present invention is to provide a memory device which operates at low voltage and with low electric power and can be designed to have small dimensions.

The foregoing object is accomplished by providing a memory device comprising a first memory array having a plurality of memory cells alloted as a matrix each of which is indicated with a column address and a row address, an X address decoder which selects a column address of said matrix, a Y address decoder which selects a row address of said matrix, data lines through which data are transferred from or to memory cells along a row selected by said Y address decoder, and a second memory array having a plurality of memory cells along a row each of which is indicated with a column address and is connected between one of said data lines and one of bus lines at a corresponding column location, wherein data transfer between said bus lines and said memory cells along the selected row is executed through said second memory array.

DETAILED DESCRIPTION OF THE PREFERRED EMBODIMENT

Figure 1:
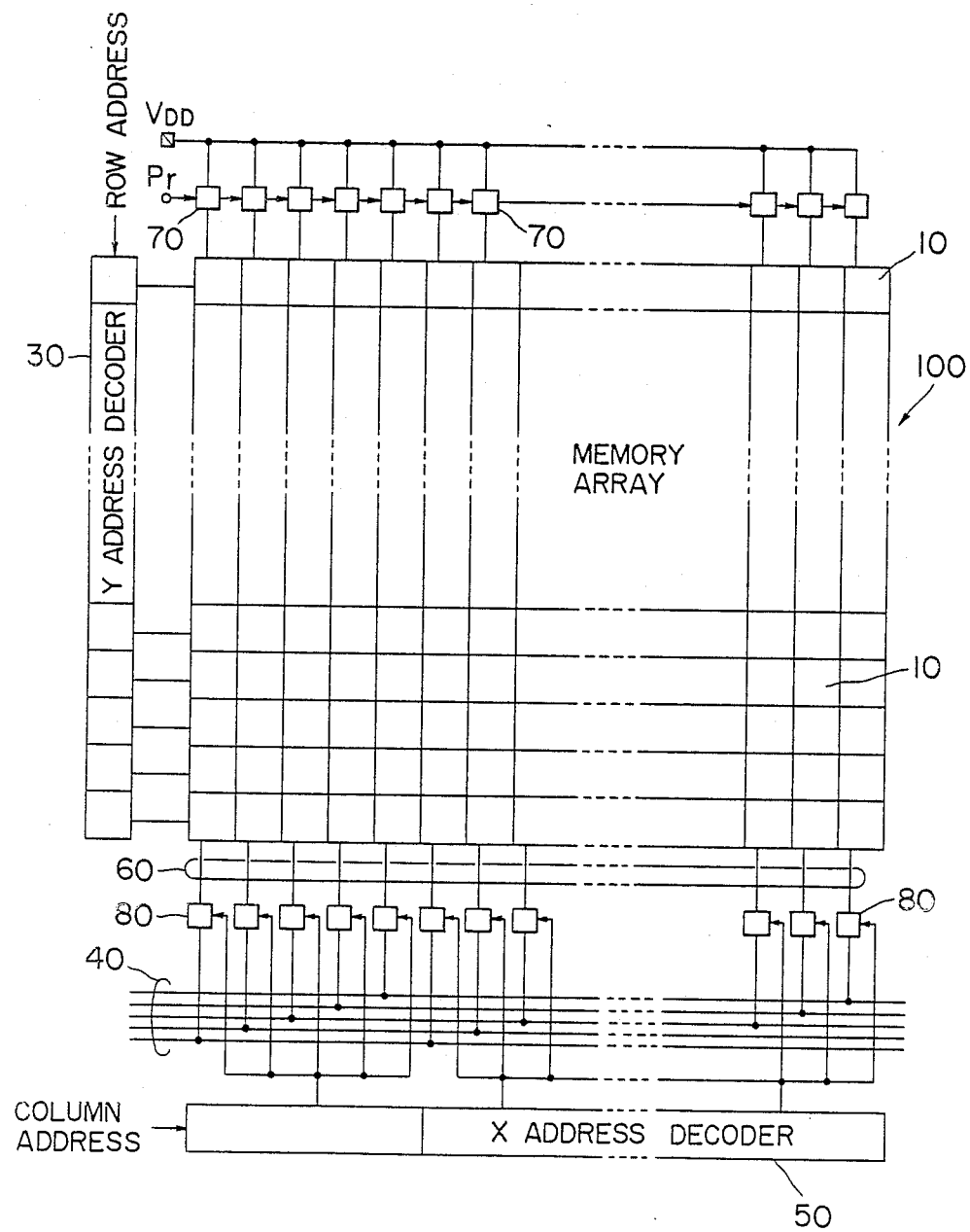
FIG. 1 is a block diagram showing a memory device according to the prior art.
Figure 2:
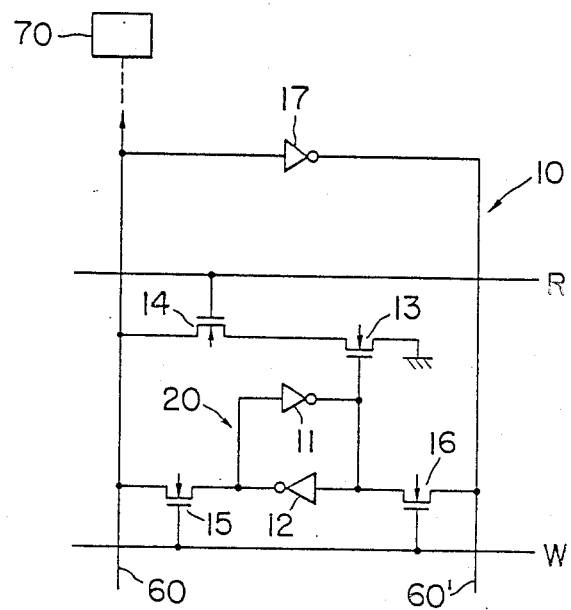
FIGS. 2 and 3 are circuit diagrams showing a memory cell which constitutes a memory device according to the prior art.
Figure 3:
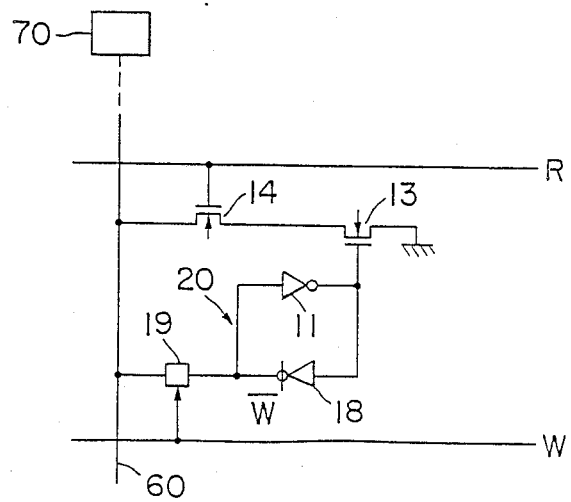
Figure 4:
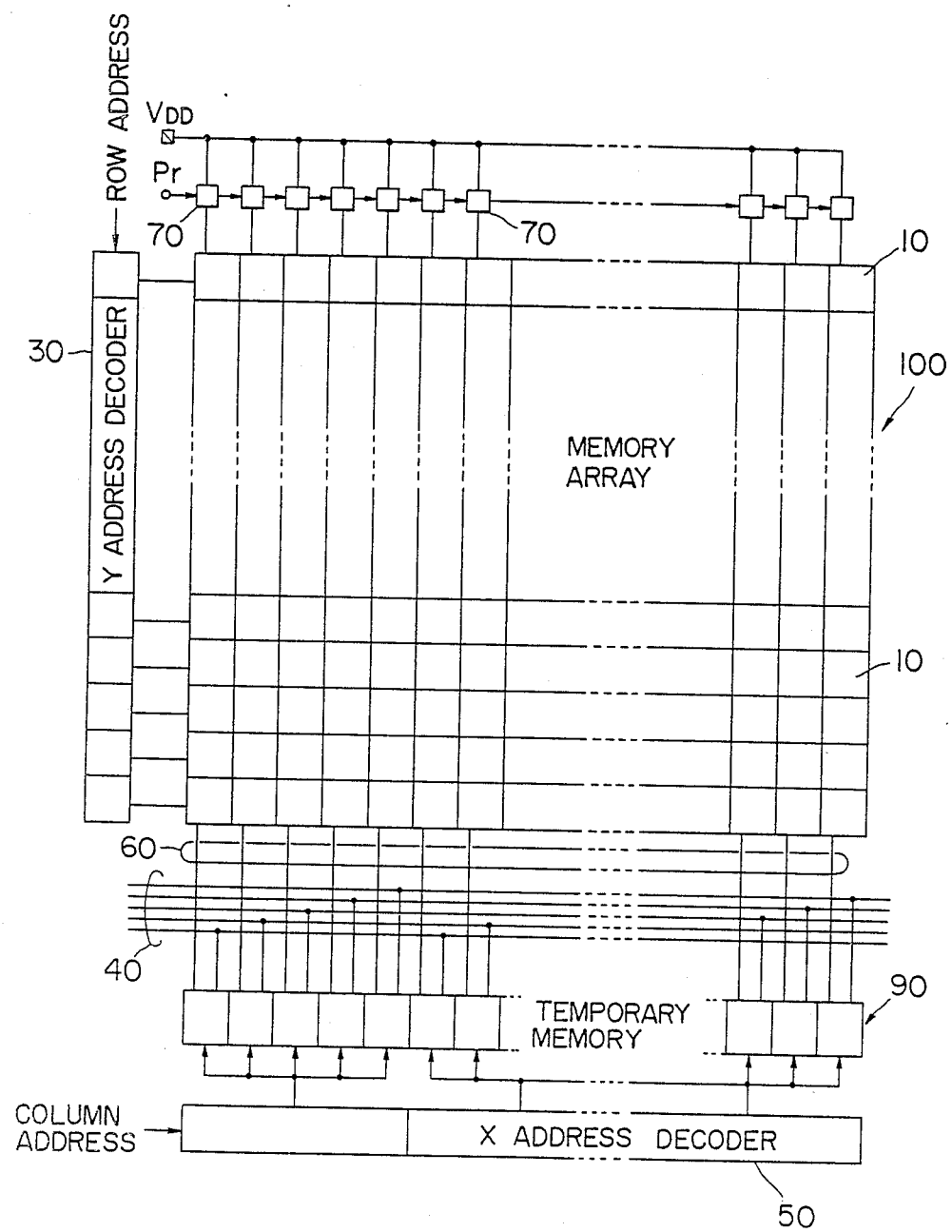
FIG. 4 is a block diagram showing a preferred embodiment according to this invention.
Figure 5:
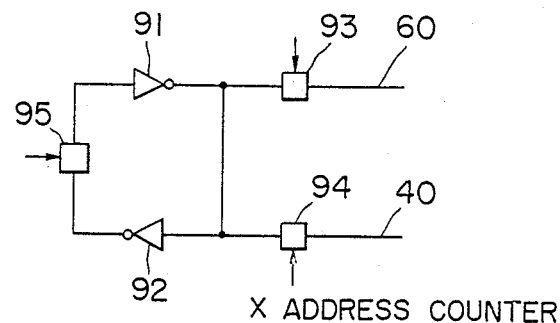
FIG. 5 is a circuit diagram of a temporary memory cell utilized in a memory device according to this invention.

Referring to FIGS. 4 through 7, a preferred embodiment of this invention will be described in detail. FIG. 4 is a block diagram showing a memory device according to this invention. This memory device is different from the prior device shown in FIG. 1 in that there is a second memory array 90 (hereinafter referred to as a temporary memory) connected between the data lines 60 and the bus lines 40. The temporary memory 90 has a capacity to store a unit phone number having several digits. In this embodiment, as each digit includes five bits, five memory cells are alloted for a digit in the temporary memory 90. A memory cell constituting the temporary memory 90 is illustrated in FIG. 5 as an example. The temporary memory cell is constituted by inverters 91 and 92 and switches 93, 94 and 95 and is connected between the data lines 60 and bus lines 40 through the switches 93 and 94.

Figure 6A:
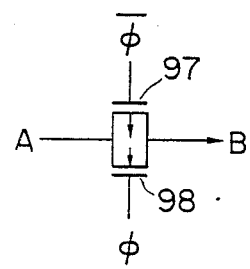
FIGS. 6a and 6b are circuit diagrams showing a switch applied to the circuit shown in FIG. 5.
Figure 6B:
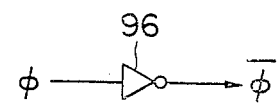

FIG. 6(a) shows one example of one of the switches 93 through 95. The switch is constituted by complimentary metal oxide semiconductor (hereinafter referred to as CMOS) transistors 97 and 98 which are connected in parallel. This switch connects or disconnects a channel between A and B depending on a pair of complimentary clock pulses $\phi$ and $\bar{\phi}$ applied to the gates of the transistors 97 and 98, respectively. A pair of complimentary clock pulses can be generated by inverting one of clock pulses through an inverter as is shown in FIG. 6(b).

Figure 7:
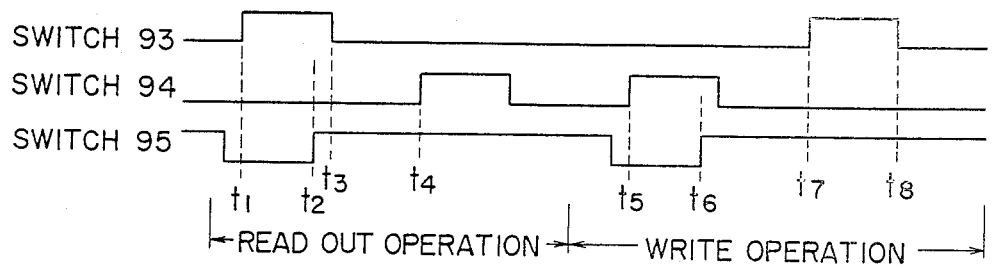
FIG. 7 is a timing chart to explain an operation of the switches shown in FIG. 5.

Now referring to a timing chart shown in FIG. 7, an operation of the embodiment shown in FIG. 4 will be described. First, a case where signals from the Y address decoder 30 are R (read out) is described. When a Y address is selected, that is, a unit phone number is indicated, all data in the memory cells 10 along the selected row are outputted to data lines 60. Then the switch 93 which connects the memory array 100 to the temporary memory 90 turns on at a time $t_1$ and the switch 95 turns on at a time $t_2$ as illustrated in FIG. 7 so that all digits of data for the selected phone number are stored in the temporary memory 90 through data lines 60. After that, the switch 93 turns off at the time $t_3$. Thereafter the digits of data are read out sequentially from the temporary memory 90 to the bus lines 40, one after another, by pointing out with the X address decoder 50. That is, in this embodiment, the switches 94 connected between the temporary memory 90 and the bus lines 40 are turned on sequentially by five bits at the time $t_4$. Thus a desired phone number is obtained on the bus lines 40.

Next, a case where signals from the Y address decoder 30 are W (write) is described. A unit phone number data transmitted through a bus line 40, digit by digit, is stored in the temporary memory 90, by sequentially turning on the switches 94 by five bits at a time $t_5$ and turning on the switches 95 at a time $t_6$. After storing all digits of data in the temporary memory 90, all the switches 93 which connect the temporary memory 90 to the memory array 100 are turned on simultaneously at the time $t_7$. In this condition, when a Y address is selected, all the digits of data in the temporary memory 90 are simultaneously stored in the selected row of the memory array 100. Then the all switches 93 are turned off and the selection with the Y address decoder 30 is made disable. Thus a desired phone number is stored in a desired row of the memory array 100.

In the memory device according to the prior art, a number of precharge (which is proportional to the number of digits) is required to read out a unit phone number. In the memory device according to this invention, data in memory cells can be read out to the temporary memory at once. Therefore the precharge operation is required only once to read out data. Thus the memory device according to this invention operates with low electric power. Further, in order to improve drive ability of the bus lines, only the temporary memory should be designed to have large dimension because the temporary memory works as a buffer and a memory cell itself is not required to have much drive ability. Therefore memory cells can be designed with small dimension and can be operated at low voltage.

Further, with regard to a write operation, since data in the temporary memory can be stored in memory cells at once, an extra readout operation prior to the write operation is not required. Therefore the operation speed can be improved.

This invention may be practiced or embodied in still other ways without departing from the spirit and the scope of the invention. For instance, switches in a memory cell may be constituted by bipolar transistors. Additionally, this memory device can be applied to not only a phone number system, but also any other system in which any number is memorized.

What is claimed is:

1. A memory device comprising:
   a first memory array having a plurality of first RAM cells arranged as a matrix, each of said first RAM cells being accessed by a column address and a row address;
   a second memory array having a plurality of second RAM cells arranged along a row, each of said second RAM cells being accessed by a column address so as to store and transfer data from or to said first memory array;
   a plurality of bus lines connected to said second memory array so as to read out data from said first memory array or to write data into said first memory array through said second memory array;
   a plurality of data lines connected between said first memory array and said second memory array so as to transfer data between said first memory array and second memory array;
   an X address decoder which outputs a column address of said matrix to said first memory array through said second memory array; and
   a Y address decoder which outputs a row address of said matrix to said first memory;
   whereby, in a read-out operation, data stored in said first memory array is simultaneously transferred to said second memory array through said data lines and stored in said second memory array, and subsequently outputted at different times from said second memory array to the bus lines, and in a write-in operation, data from the bus lines is outputted to and stored in said second memory array at different times and subsequently simultaneously transferred from said second memory array to said first memory array along said data lines.

2. A memory device according to claim 1 wherein memory cells along a row in said first memory array contain a unit phone number.

3. A memory device according to claim 1 wherein said data lines are precharged during said readout operation.

4. A memory device according to claim 1 wherein said second memory array comprises first switches connected between said data lines and a temporary storage and second switches connected between said bus lines and said temporary storage.

5. A memory device according to claim 4 wherein said first switches and said second switches are controlled so as to turn on alternately.

6. A random access memory device comprising:
   a first memory array having a plurality of first memory cells arranged as a matrix having m columns and n rows, each of said first memory cells, which are divided into d sub-cells, being accessed with a column address and a row address;
   a second memory array having a plurality of second memory cells for storing data, said plurality of second memory cells arranged as a row having m columns, each of said second memory cells, which are divided into d sub-cells, being accessed with a column address;
   an X address decoder which selects a column address of said second memory array;
   a Y address decoder which selects a row address of said first memory array;
   data lines, each of which connects one of said second memory cells and one of said first memory cells on the row selected by said Y address decoder, said one second memory cell and the one connected first memory cell each having the same column address; and
   a set of d bus lines connected to said second memory array for outputting data to the device and outputting data from the device;
   wherein data transfer between said first memory array and said second memory array is carried out simultaneously for all m columns through said data lines when said Y address decoder selects a row address, said data being stored temporarily in said second memory array, and data transfer between said second memory array and said set of d bus lines is carried out at different times when said X address decoder selects a column address, said X address decoder selecting sequentially each of said second memory cells.

7. The memory device according to claim 6 wherein said data lines are prearranged during a readout operation.

8. The memory device according to claim 6 wherein each of said sub-cells comprises a temporary storage, a first switch connected between a data line and said temporary storage and a second switch connected between a line of said set of bus lines and said temporary storage.

9. The memory device according to claim 8 wherein said first switch and said second switch are controlled so as to turn on alternatively.

* * * * *